United States Patent [19]
Hanaoka et al.

[11] Patent Number: 6,001,720
[45] Date of Patent: Dec. 14, 1999

[54] METHOD FOR FORMING OHMIC CONTACT

[75] Inventors: Katsunari Hanaoka, Ono; Ikuo Shiota, Hyogo-ken, both of Japan

[73] Assignee: Ricoh Company, Ltd., Tokyo, Japan

[21] Appl. No.: 08/726,862

[22] Filed: Oct. 4, 1996

Related U.S. Application Data

[63] Continuation of application No. 08/461,664, Jun. 5, 1995, abandoned.

[30] Foreign Application Priority Data

Jun. 27, 1994 [JP] Japan .................................. 6-144440

[51] Int. Cl.$^6$ .......................... H01L 21/265; H01L 21/28; H01L 21/31
[52] U.S. Cl. .......................... 438/597; 438/530; 438/533; 438/950
[58] Field of Search ..................... 437/187, 195, 437/231; 156/653.1, 659.11; 438/597, 514, 515, 530, 533, 660, 663, 637, 640, 942, 950

[56] References Cited

U.S. PATENT DOCUMENTS

| | | | |
|---|---|---|---|
| 5,037,777 | 8/1991 | Mele et al. .............................. | 437/195 |
| 5,061,644 | 10/1991 | Yue et al. .................................. | 437/31 |
| 5,200,635 | 4/1993 | Kaga et al. ............................... | 257/306 |
| 5,422,308 | 6/1995 | Nicholls et al. ......................... | 438/233 |
| 5,449,644 | 9/1995 | Hong et al. .............................. | 437/225 |
| 5,620,926 | 4/1997 | Itoh ........................................ | 438/530 |

FOREIGN PATENT DOCUMENTS

| | | |
|---|---|---|
| 61-38858 | 9/1986 | Japan . |
| 61-222235 | 10/1986 | Japan . |

*Primary Examiner*—T. N. Quach
*Attorney, Agent, or Firm*—Cooper & Dunham LLP

[57] ABSTRACT

A method for forming ohmic contact has the steps of a) a process for forming an insulating film having a predetermined thickness on a diffusive layer formed on a semiconductor substrate; b) a process for forming a mask on the insulating film; the mask having a small selective ratio with respect to the insulating film and having an opening portion for a contact hole; c) a process for implanting ions into the diffusive layer through the opening portion; d) a process for taking heat treatment to electrically activate the implanted ions; e) a process for completely removing the mask and forming the contact hole by simultaneously etching the mask and the insulating film exposed through the opening portion of the mask; and f) a process for making an electrode come in ohmic contact with the semiconductor substrate exposed from the formed contact hole. In this method, the ohmic contact is formed with high accuracy with respect to a fine contact hole.

5 Claims, 8 Drawing Sheets

OHMIC CONTACT

METHOD FOR FORMING OHMIC CONTACT

This is a continuation of application Ser. No. 08/461,664 filed Jun. 5, 1995, abandoned.

BACKGROUND OF THE INVENTION

1. Field of the Invention

The present invention relates to a method for forming ohmic contact between a semiconductor substrate and electrode wiring.

2. Description of the Related Art

For example, ohmic contact between a semiconductor substrate and electrode wiring has a structure as shown in FIGS. 1a and 1b. The ohmic contact shown in FIGS. 1a and 1b is formed by the following procedures. First, a partially thick oxide film 3 is formed on a p-type semiconductor (Si) substrate 1 by a thermal oxidizing method using a predetermined mask. For example, this oxide film 3 is formed by an $SiO_2$ film having a thickness of 1.0 μm. After the above mask is then removed, a thin oxide film 2 is formed in a masked portion. For example, this oxide film 2 is constructed by an $SiO_2$ film having a thickness from 0.03 to 0.10 μm. This oxide film 2 is set to a gate oxide film. Next, a polycrystal silicon film or a thin film of a high melting point metal is formed by a CVD method or a sputtering method such that this film has a thickness from 1.0 to 1.5 μm. Next, required portions are left and the other portions are removed with this metallic thin film as a gate electrode portion and wiring. Next, phosphorus (P) or arsenic (As) acting as n-type impurities is implanted by a thermal diffusive method or an ion implanting method with the gate electrode portion 2 and the thick oxide film 3 as masks. Thus, a source region, a drain region and an $n^+$ wiring region 2 are formed on a substrate surface. Next, a PSG film 4 is formed on an entire upper face of the substrate by the CVD method. The PSG film 4 is made of mixing glass of $SiO_2—P_2O_5$. Next, a contact hole 6 as an opening is formed in the PSG film 4. The substrate upper face is then covered with a metallic thin film 5 having aluminum as a principal component. Thereafter, the metallic thin film 5 is selectively removed from the substrate upper face so that electrode wiring coming in contact with the $n^+$ region of the substrate is formed.

As shown in FIGS. 1a and 1b, the contact hole 6 is surrounded by the $n^+$ layer 2 with a predetermined margin. Therefore, a wiring region formed by the $n^+$ layer 2 has an area wider than the contact hole 6. Further, a wiring interval of adjacent separate $n^+$ layers is also determined in accordance with a size of this contact hole. It is considered to improve an integration degree of an electric circuit that a size of the wiring region formed by the $n^+$ layer 2 is reduced and the size of the contact hole 6 is approximately equal to or slightly greater than that of the $n^+$ layer 2. However, in this case, the oxide film 3 is also etched together with the PSG film 4 so that there is a danger of exposing the p-type semiconductor substrate 1. In particular, when a thin $n^+$ layer is formed by the ion implanting method, the danger of exposing the p-type semiconductor substrate 1 by the above etching becomes very high. Further, there is a case in which the p-type semiconductor substrate is exposed to the contact hole even when the position of a mask pattern is slightly shifted at a time of photolithography for forming the contact hole. When electrode wiring is formed in a state in which the p-type semiconductor substrate 1 is exposed to the contact hole, the electrode wiring comes in contact with the p-type semiconductor substrate 1 as well as the desired $n^+$ layer 2 so that a p/n junction is broken. As a result, the function of a formed integrated circuit itself is damaged.

For example, Japanese Patent Publication (KOKOKU) No. 61-38858 shows a manufacturing method of a semiconductor device for solving this problem. In this manufacturing method, a semiconductor in a contact hole portion of a source and a drain is exposed. Thereafter, ions are again implanted into the semiconductor so that exposure of a p-type semiconductor substrate is corrected. In accordance with this manufacturing method, it is possible to prevent the above p/n junction from being broken by a shift in mask pattern at the photolithographic time.

However, in the above manufacturing method of the semiconductor device, heat treatment is taken after the contact hole is opened. When an insulating film having a reflowing property is used, a shape of the contact hole is changed and deformed. Therefore, when the contact hole is small, there is a case in which the contact hole once opened is closed by the above deformation. Accordingly, there is a constant restriction on fining of the contact hole.

SUMMARY OF THE INVENTION

It is therefore an object of the present invention to provide a method for forming ohmic contact with high accuracy with respect to a fine contact hole.

The above object can be achieved by a method for forming ohmic contact, comprising the steps of:

a) a process for forming an insulating film having a predetermined thickness on a diffusive layer formed on a semiconductor substrate;

b) a process for forming a mask on the insulating film; the mask having a small selective ratio with respect to the insulating film and having an opening portion for a contact hole;

c) a process for implanting ions into the diffusive layer through the opening portion;

d) a process for taking heat treatment to electrically activate the implanted ions;

e) a process for completely removing the mask and forming the contact hole by simultaneously etching the mask and the insulating film exposed through the opening portion of the mask; and f) a process for making an electrode come in ohmic contact with the semiconductor substrate exposed from the formed contact hole.

The mask formed on the insulating film is preferably constructed by a multilayer structure including a photoresist.

The mask formed on the insulating film is also preferably constructed by a multilayer structure including a photoresist and a layer which is formed below the photoresist and has a heat resisting property and a small selective ratio.

The heat resisting layer constituting the mask of the multilayer structure and having the small selective ratio is preferably constructed by a SOG film.

The heat treatment after the ion implantation is preferably taken by heating a lamp.

In the forming method of ohmic contact in the present invention, the heat treatment for electrically activating ions implanted into the diffusive layer is taken through the insulating film before the contact hole is opened. Since the heat treatment is taken before the contact hole is opened, no shape of the contact hole is deformed by the heat treatment. After the heat treatment is completed, the contact hole is opened and ohmic contact between the contact hole and an electrode is formed. The same mask as a mask for opening the contact hole is used in the ion implantation so that a p/n connection is selectively formed in the contact hole. Therefore, a p/n junction is formed in a correct position even when the mask is shifted at a photolithographic time. Further, the mask having an opening portion for the contact hole is constructed by a mask having a small selective ratio with respect to the insulating film. Therefore, the contact hole is formed by etching in a sequentially tapered shape.

Further objects and advantages of the present invention will be apparent from the following description of the preferred embodiments of the present invention as illustrated in the accompanying drawings.

BRIEF DESCRIPTION OF THE DRAWINGS

FIG. 1b is a cross-sectional view of a portion of the ohmic contact shown in FIG. 1a;

DESCRIPTION OF THE PREFERRED EMBODIMENTS

The preferred embodiments of a method for forming ohmic contact in the present invention will next be described in detail with reference to the accompanying drawings.

In a semiconductor device of the present invention, after ions are implanted through an insulating film by using a mask pattern, heat treatment for activating the implanted ions is taken. A contact hole is opened after this heat treatment. Accordingly, no shape of the contact hole is influenced by the heat treatment. A p/n connection is selectively formed in the contact hole by using the same mask as a mask for opening the contact hole in the ion implantation. Therefore, it is possible to effectively prevent a p/n junction from being broken by a shift in mask pattern tending to be caused at a time of photolithography.

The contact hole is formed in a sequentially tapered shape by using a SOG film as a mask having a small selective ratio with respect to the insulating film. Therefore, more preferable ohmic contact can be formed.

In the following description, formation of ohmic contact will be explained by using a forming method of the ohmic contact in accordance with an embodiment of the present invention. Thereafter, characteristics of the ohmic contacts formed in the embodiment and formed by the general forming method will be compared with each other.

(1) Embodiment

Each of forming processes of ohmic contact in an embodiment of the present invention will next be explained in accordance with the following separate items (a) to (m).

Figure 2:
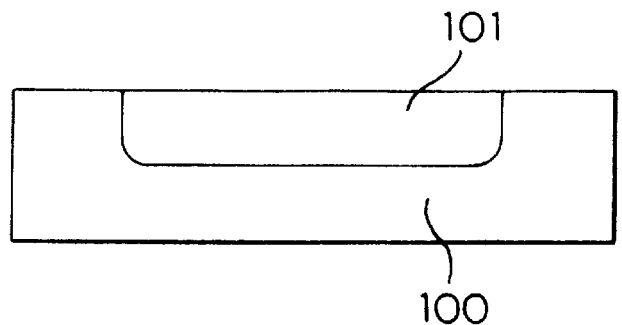
FIG. 2 is a cross-sectional view of an ohmic contact forming portion when an n-well 101 is formed within a p-type substrate 100 by thermal diffusion in the present invention.

(a) First, an n-well 101 is formed on a p-type silicon substrate 100 by thermal diffusion. FIG. 2 shows a state of the silicon substrate 100 in this case.

Figure 3:
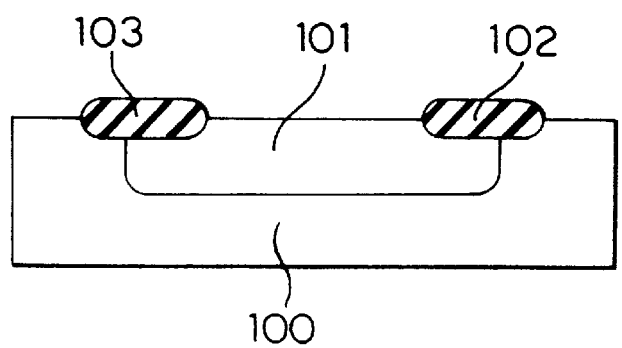
FIG. 3 is a view showing the construction of an ohmic contact forming portion when element separating thermal oxide films 102 and 103 are formed by a LOCOS method.

(b) Next, element separating oxide films 102 and 103 are formed by a LOCOS method as shown in FIG. 3.

Figure 4:
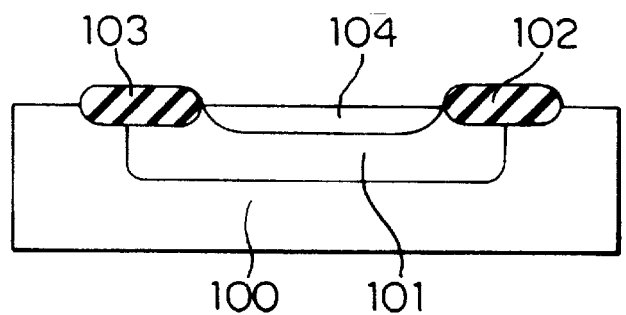
FIG. 4 is a view showing the construction of an ohmic contact portion when a p-type diffusive layer 104 having high concentration is formed on the n-well 101.

(c) Next, a p-type diffusive layer 104 having high concentration is formed on the above n-well 101 as shown in FIG. 4. When impurities of this diffusive layer are implanted, each of the above element separating oxide films 102 and 103 acts as a mask. Therefore, as shown in FIG. 4, no p-type diffusive layer 104 is formed on a lower side of each of the element separating oxide films 102 and 103.

Figure 5:
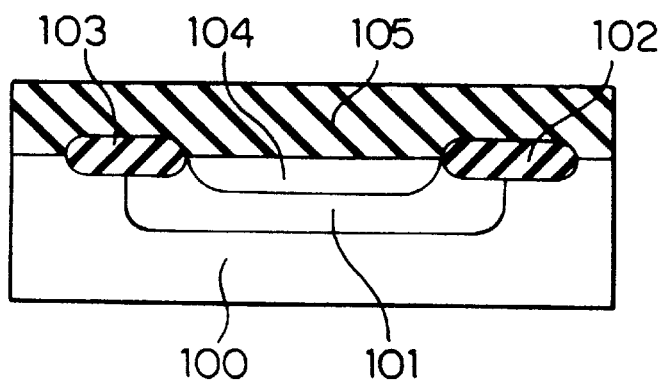
FIG. 5 is a cross-sectional view showing an ohmic contact forming portion when a BPSG film 105 having a reflowing property is formed by a CVD method.

(d) Next, a BPSG film 105 as an insulating film having a reflowing property is formed on the p-type silicon substrate 100 and the element separating oxide films 102 and 103 by a thermal CVD method such that the BPSG film 105 has 900 nm in thickness. Thereafter, as shown in FIG. 5, the BPSG film 105 is heated for 20 minutes at a temperature of 850° C. in heat treatment to flatten the BPSG film 105.

Figure 6:
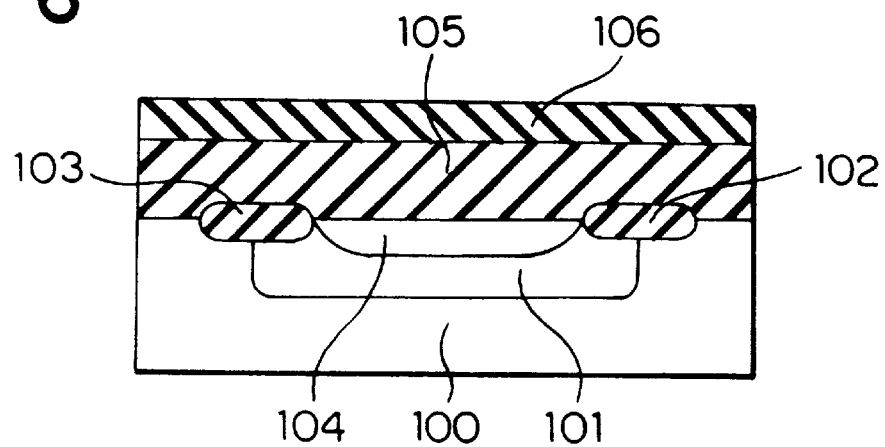
FIG. 6 is a cross-sectional view showing an ohmic contact forming portion when silica-on glass 106 as a SOG film is formed by the CVD method.

(e) As shown in FIG. 6, spin-on glass 106 as a SOG film having 500 nm in thickness is formed by a spin-coat method on the BPSG film 105 flattened by the above heat treatment.

Figure 7:
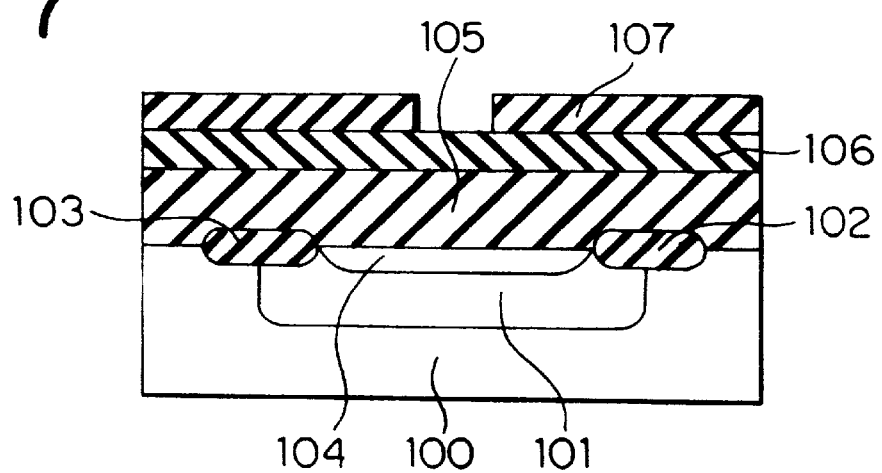
FIG. 7 is a cross-sectional view showing an ohmic contact forming portion including a photoresist pattern 107 in a contact hole opening portion formed by a photolithographic technique.

(f) Next, a photoresist pattern 107 of a contact hole opening portion is formed by a photolithographic technique as shown in FIG. 7.

Figure 8:
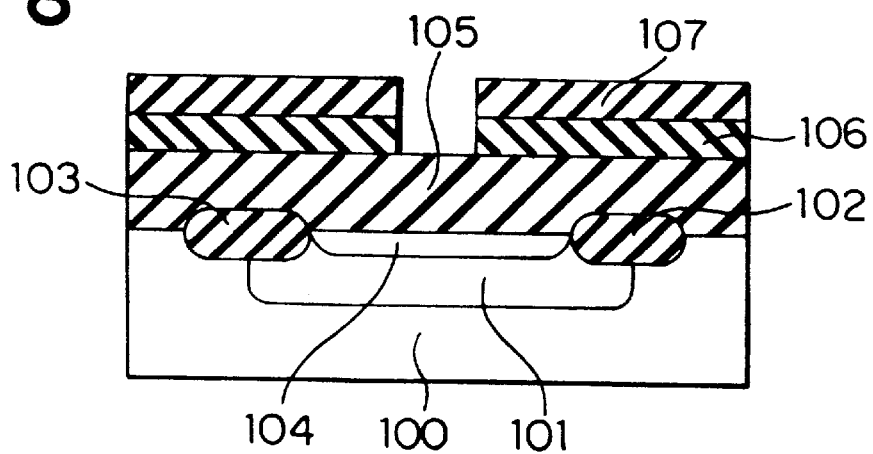
FIG. 8 is a cross-sectional view showing an ohmic contact forming portion when a silicon nitride film 106 in the contact hole opening portion is selectively removed therefrom.

(g) The formed photoresist pattern 107 is used as a mask and the SOG film 106 is etched for 50 seconds by using an RIE (reactive ion etching) method and applying an R.F output of 750 W to the SOG film at a pressure of 600 Torr, an argon (Ar) flow rate of 600 sccm, a $CHF_3$ flow rate of 30 sccm, and a $CF_4$ flow rate of 30 sccm. In this condition, the SOG film 106 is etched at a rate of 600 nm per minute. Therefore, as shown in FIG. 8, the SOG film 106 in a photoresist pattern opening portion is completely removed therefrom.

Figure 9:
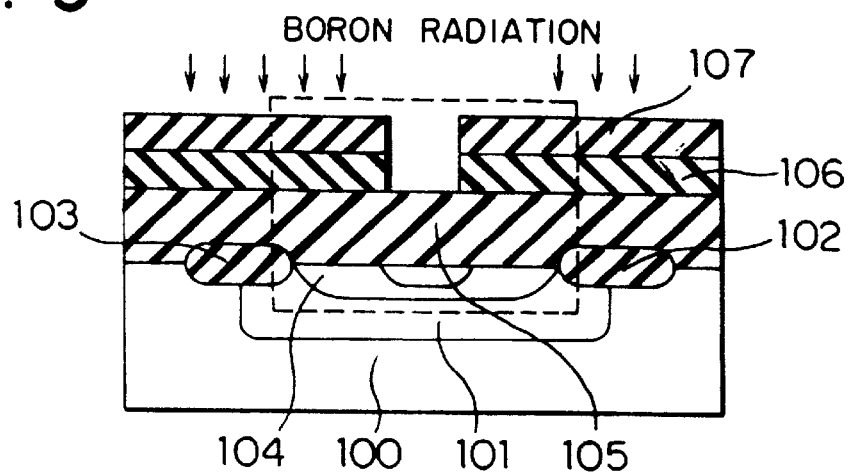
FIG. 9 is a cross-sectional view showing an ohmic contact forming portion when boron ions are implanted into the p-type diffusive layer by boron radiation.

(h) Next, boron ions having 350 KeV in energy are implanted onto the photoresist. Ranges of the implanted boron ions having this energy are 900 nm within the BPSG film 105. Therefore, as shown in FIG. 9, the implanted boron ions are distributed near a surface of the p-type diffusive layer 104. In accordance with a distribution rate or percentage of the implanted boron ions in a transversal direction, 90% of the implanted boron ions or more is distributed within 0.2 $\mu$m outside the mask opening portion of a contact hole. If the boron ions are implanted in accordance with the above procedures, it is possible to completely prevent the p-type silicon substrate 100 from being exposed by a shift in mask pattern.

Figure 10:
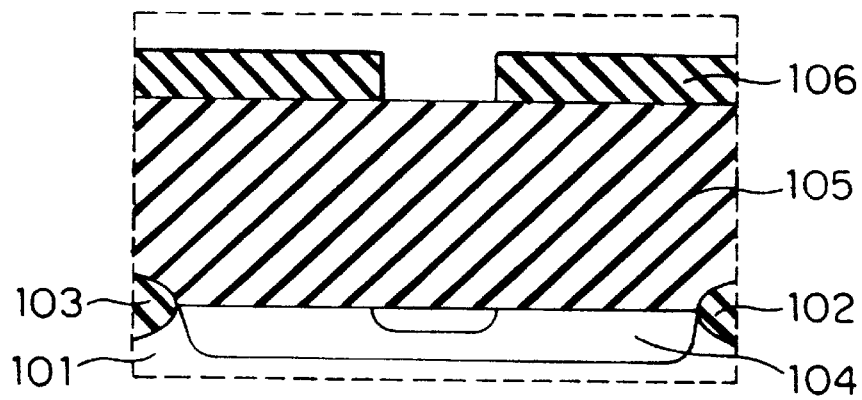
FIG. 10 is a cross-sectional view showing an ohmic contact forming portion when the photoresist pattern 107 is removed by oxygen plasma.

(i) Next, the photoresist pattern 107 is removed by oxygen plasma. Further, as shown in FIG. 10, the implanted boron ions are heated for 10 seconds at a temperature of 975° C. by using a lamp heating method within a nitrogen atmosphere so as to electrically activate the implanted boron ions. At this time, no contact hole is opened yet in the BPSG film 105. Therefore, no contact hole is deformed by this heat treatment.

Figure 11:
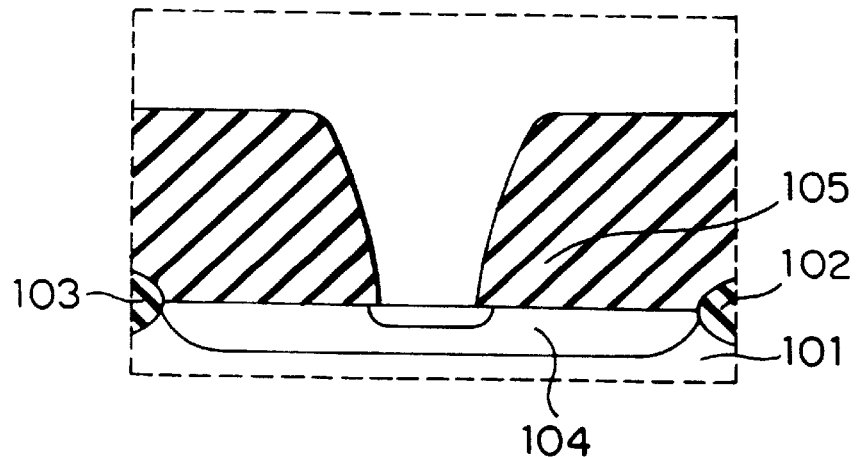
FIG. 11 is a cross-sectional view showing an ohmic contact forming portion after dry etching is performed by a RIE (reactive ion etching) method.

(j) The SOG film 106 is again etched for 50 minutes by using the RIE method and applying an R.F output of 750 W to the SOG film at a pressure of 600 Torr, an argon (Ar) flow rate of 600 sccm, a $CHF_3$ flow rate of 30 sccm, and a $CF_4$ flow rate of 30 sccm. In this condition, the SOG film 106 is etched at a rate of 600 nm per minute. Therefore, the entire SOG film 106 is etched back on the BPSG film 105. An etching rate of the BPSG film 105 is set to 1.2 $\mu$m per minute. Accordingly, the BPSG film is removed from the mask opening portion of the contact hole so that the silicon substrate is exposed. At this time, as shown in FIG. 11, the contact hole is formed in a sequentially tapered shape by simultaneously etching back the SOG film 106 and removing the BPSG film from the mask opening portion. This is because a selective ratio of the SOG film at an etching time is small.

Figure 12:
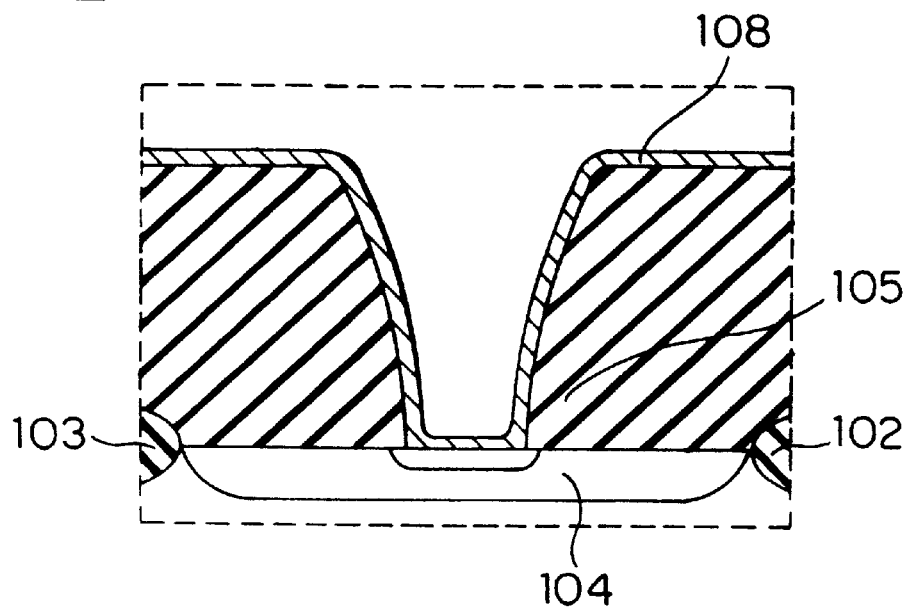
FIG. 12 is a cross-sectional view showing an ohmic contact forming portion in which a titanium (Ti) film 108 is formed by a D. C magnetron sputtering method.

(k) As shown in FIG. 12, a titanium (Ti) film 108 having 500 nm in thickness is formed by a D.C magnetron sputtering method.

Figure 13:
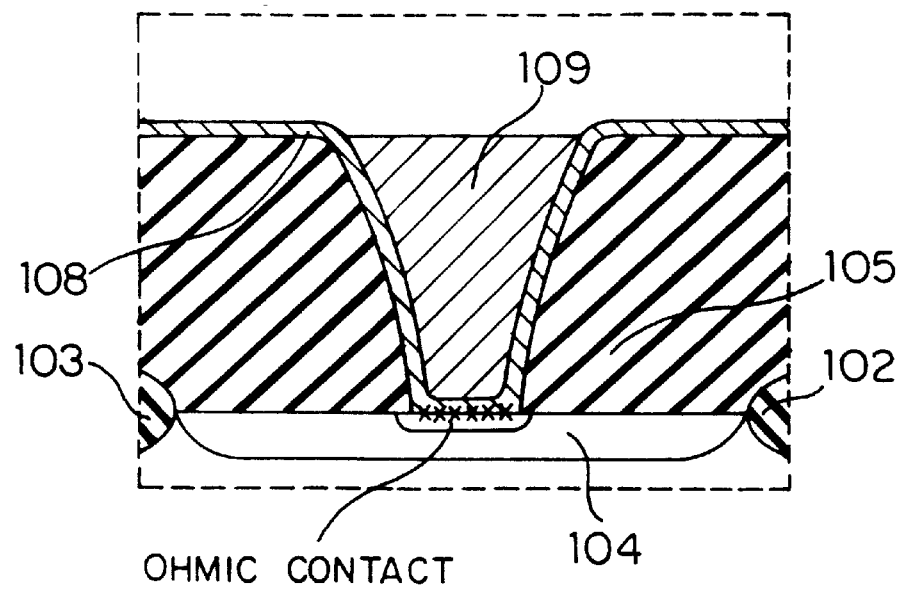
FIG. 13 is a cross-sectional view showing an ohmic contact portion when the titanium film 108 and an implanting region of boron come in ohmic contact with each other by a lamp heating method.

(l) Next, the titanium film 108 is heated for 30 seconds at a temperature of 750° C. within a nitrogen atmosphere by the lamp heating method. Thus, as shown in FIG. 13, the titanium film 108 and an implanting region of the above heated implanted boron ions come in ohmic contact with each other.

Figure 14:
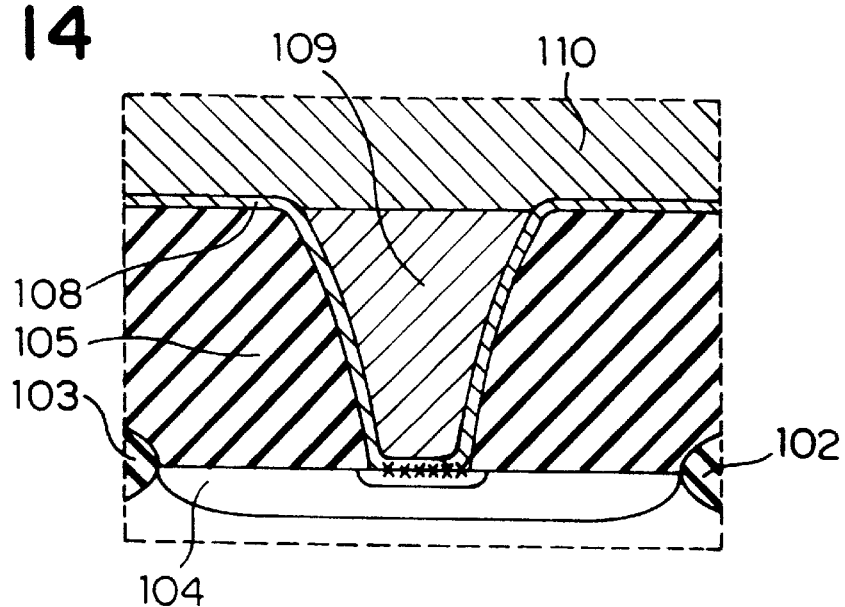
FIG. 14 is a cross-sectional view showing an ohmic contact forming portion when a push-in plug 109 is formed by a W-CVD method.
Figure 15:
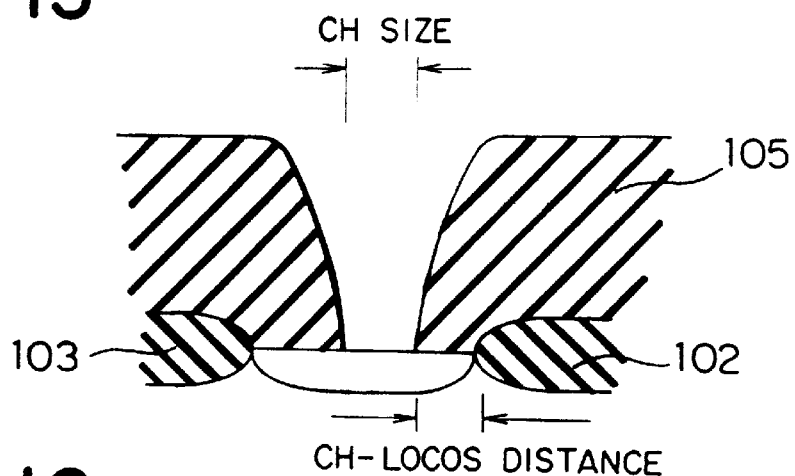
FIG. 15 is a view showing a measuring portion in which a CH size on a substrate and a distance between a CH edge and a LOCOS edge are measured.

(m) A fill-in plug 109 is then formed by a W-CVD method. After an aluminum film 110 having 600 nm in thickness is formed by the D.C magnetron sputtering method, a wiring pattern is formed by a photolithographic method as shown in FIG. 14.

In the ohmic contact formed by the above forming method, no contact hole is deformed by the heat treatment taken in activation of the implanted boron ions even when an insulating film having a reflowing property is used. Further, the contact hole is formed in a sequentially tapered shape by using a SOG film having a small selective ratio as a mask. Therefore, the ohmic contact can be formed more preferably. The ohmic contacts formed in this embodiment and formed by the general forming method will next be compared with each other to explain detailed characteristics of the ohmic contact formed by the ohmic contact forming method of the present invention.

Figure 1A:
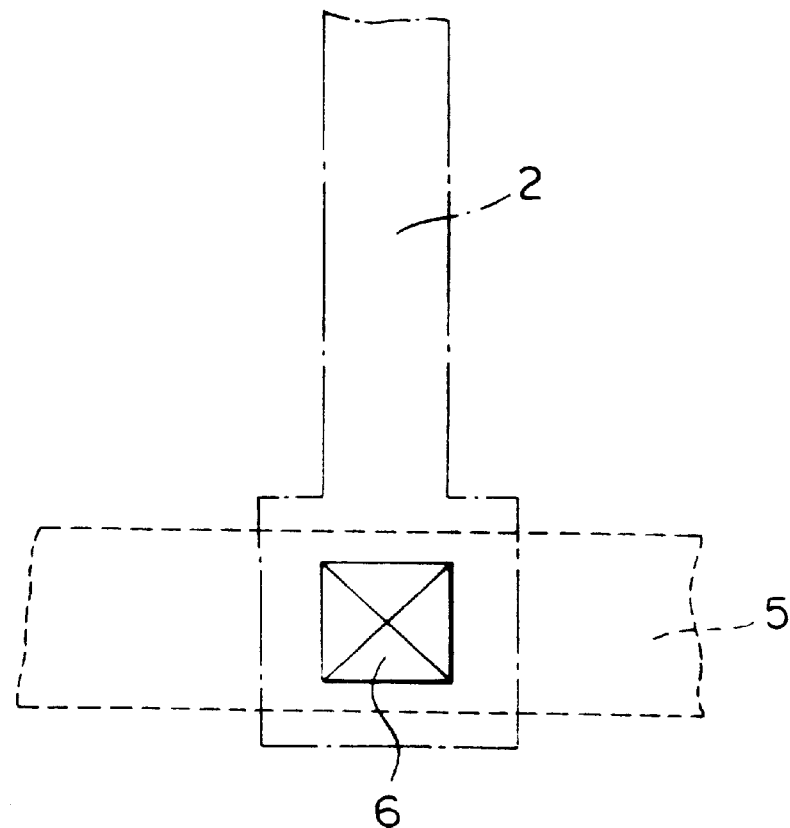
FIG. 1a is a front view showing ohmic contact formed by a general technique.
Figure 1B:
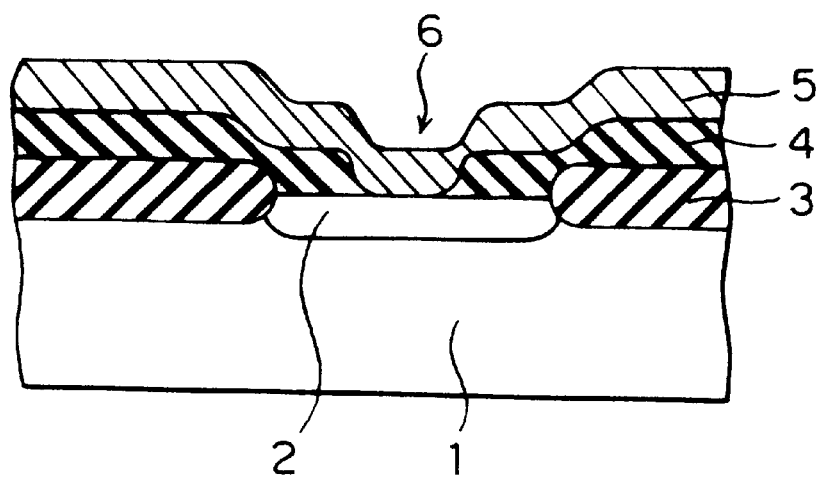

In the above forming method of the ohmic contact in the present invention, no p-type silicon substrate 100 as an element separating region is exposed to the contact hole even when a mask is shifted at an opening time of the contact hole. Therefore, no p/n junction of a source and a drain of a MOS transistor is broken by a contact hole portion as in the general example shown in FIGS. 1a and 1b.

(2) Comparison (2-1) General forming method of ohmic contact.

A general forming method of ohmic contact will first be explained. First, the same processings as processings (a) to (d) in the above embodiment of the present invention are executed.

Thereafter, the following processings (e)" and (f)" are executed.

Figure 17A:
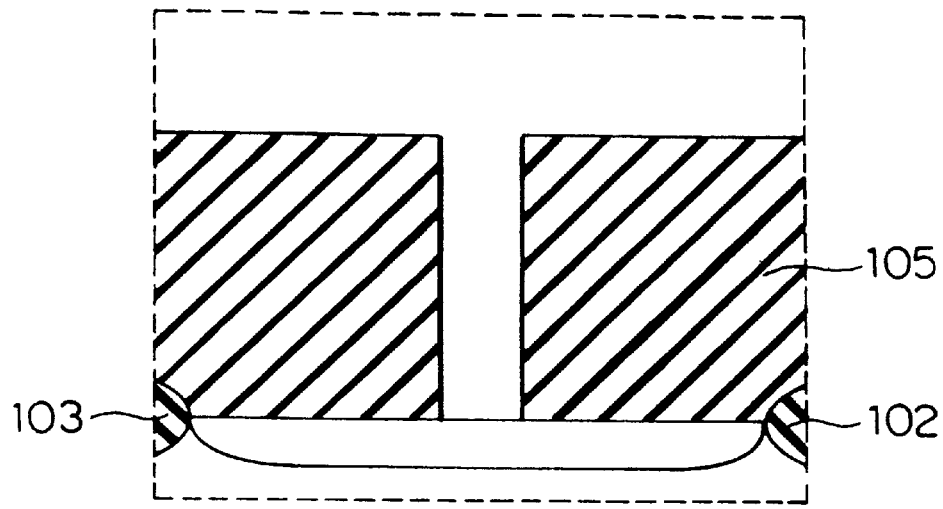
FIG. 17a is a view showing a contact hole formed by selectively removing an oxide film of a photoresist opening portion therefrom.

(e)" After a photoresist pattern 107 of a contact hole opening portion is formed, a silicon nitride 106 is selectively removed from this opening portion by using gases of Ar (argon), $CHF_3$ and $CF_4$ so that a contact hole is formed as shown in FIG. 17a.

Figure 17B:
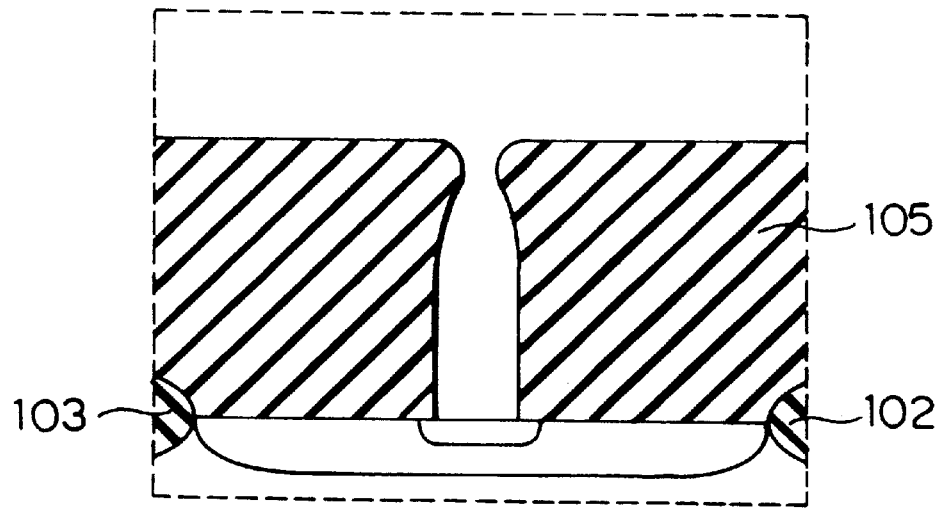
FIG. 17b is a view showing a contact hole deformed by heat treatment.

(f)" After the photoresist pattern 107 is removed from the contact hole opening portion, $BF_2$ ions having 30 KeV in energy are implanted onto an entire surface of the opening portion. The implanted ions are heated for 10 seconds at a temperature of 975° C. within a nitrogen atmosphere by a lamp heating method so as to electrically activate the implanted ions. A BPSG film reflows by this heating so that the contact hole is deformed as shown in FIG. 17b.

The same processings as processings (k) to (m) in the above embodiment are then executed. Since a shape of the contact hole is deformed as shown in FIG. 17b, no uniform titanium film is formed by a D.C magnetron sputtering method in the next processing (k). In this case, no titanium film required to form ohmic contact is formed on a bottom face of the contact hole in the next processing (l).

(2-2) Comparison of ohmic contacts formed in the embodiment and formed in the general forming method.

In this comparison, a CH size of each of samples of the ohmic contacts is set to 0.4 $\mu$m, 0.5 $\mu$m, 0.6 $\mu$m and 0.8 $\mu$m as shown in the following table 1. With respect to each of these CH sizes, a CH-LOCOS distance value of each of these samples is set to −0.2 $\mu$m, −0.1 $\mu$m, 0.0 $\mu$m, +0.1 $\mu$m and +0.2 $\mu$m.

TABLE 1

| CH size | distance from CH edge to LOCOS edge |
|---|---|
| 0.4 $\mu$m | −0.2$\mu$m |
| 0.4 $\mu$m | −0.1$\mu$m |
| 0.4 $\mu$m | 0.0$\mu$m |

TABLE 1-continued

| CH size | distance from CH edge to LOCOS edge |
|---|---|
| 0.4 μm | +0.1 μm |
| 0.4 μm | +0.2 μm |
| 0.5 μm | −0.2 μm |
| 0.5 μm | −0.1 μm |
| 0.5 μm | 0.0 μm |
| 0.5 μm | +0.1 μm |
| 0.5 μm | +0.2 μm |
| 0.6 μm | −0.2 μm |
| 0.6 μm | −0.1 μm |
| 0.6 μm | 0.0 μm |
| 0.6 μm | +0.1 μm |
| 0.6 μm | +0.2 μm |
| 0.8 μm | −0.2 μm |
| 0.8 μm | −0.1 μm |
| 0.8 μm | 0.0 μm |
| 0.8 μm | +0.1 μm |
| 0.8 μm | +0.2 μm |

Figure 16:
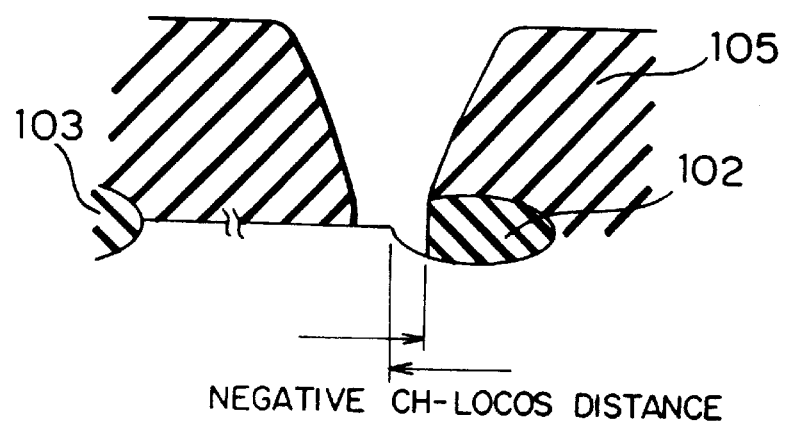
FIG. 16 is a view showing states of the CH and LOCOS edges on a semiconductor when the distance between the CH and LOCOS edges is a negative value.

When the CH-LOCOS distance value is negative, this negative distance value means that the relation in position between a CH edge portion of the contact hole and a LOCOS edge portion of a separating thermal oxide film 102 is provided as shown in FIG. 16.

Figure 18:
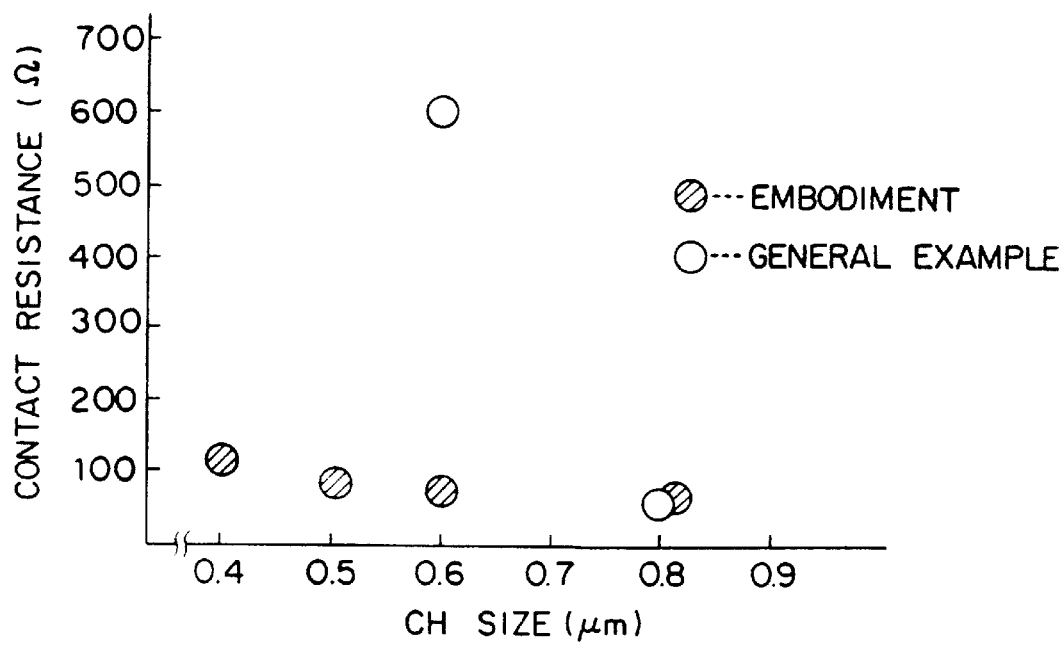
FIG. 18 is a graph showing measured results of contact resistance with respect to each of diameters of contact holes in ohmic contacts formed in an embodiment of the present invention and formed by the general technique.

FIG. 18 is a graph showing measured results of contact resistances of the ohmic contacts formed in the above embodiment and formed by the above general forming method. In the above embodiment, each of the CH-LOCOS distances is set to 0.2 μm and the CH size is set to 0.4 μm, 0.5 μm, 0.6 μm and 0.8 μm. As shown in FIG. 18, in the ohmic contact formed by the forming method in the embodiment, resistance of an ohmic contact portion is a very low value such as 130 Ω even when the CH size is reduced and set to 0.4 μm. This is because no heat treatment in activation of the implanted ions has any influence on the shape of the contact hole. In contrast to this, in the general example, the resistance of an ohmic contact portion is 600 Ω even when the CH size of the contact hole is 0.6 μm. This is because no titanium film is suitably formed on a bottom face of the contact hole by deformation of the contact hole caused by the heat treatment. Further, when the CH size of the contact hole is equal to or smaller than 0.5 μm, the CH size of an opening portion is equal to or smaller than 0.1 μm by deformation of the contact hole caused by the above heat treatment so that no ohmic contact can be actually formed. The ohmic contact formed in the embodiment has an opening portion formed in a sequentially tapered shape as shown in FIG. 12 so that such a phenomenon is not caused.

Figure 19:
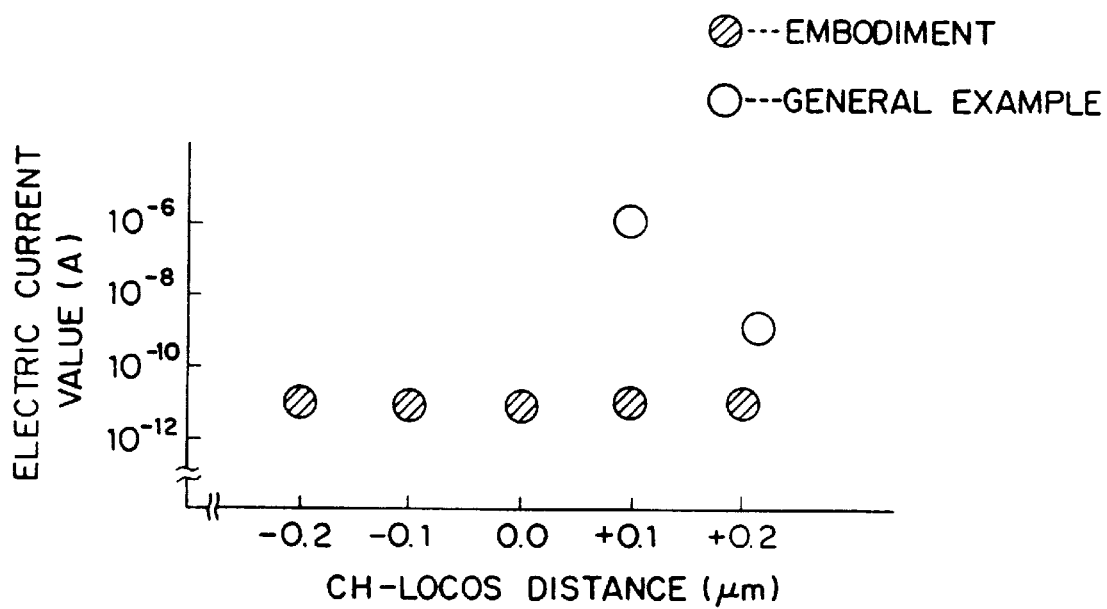
FIG. 19 is a graph showing electric current values of ohmic contact portions formed in the embodiment of the present invention and formed by the general technique when a bias voltage 3.3 V of a p/n junction type is applied to each of the ohmic contact portions.

FIG. 19 is a graph showing an electric current value of an ohmic contact portion formed in the above embodiment when a reverse bias voltage 3.3 V of a p/n junction is applied to this ohmic contact portion. In the embodiment, the ions are implanted and the contact hole is formed by using the same mask. Thus, a p/n junction can be self-selectively formed in an opening portion of the contact hole. It should be understood that only a small electric current such as about $10^{-11}$ A flows through an ohmic contact portion formed in the embodiment even when an alignment shift is sequentially increased from 0.2 μm to −0.2 μm. Namely, a shift in mask such as about 0.2 μm is allowed in formation of the ohmic contact in the embodiment. In contrast to this, in the general example shown in FIG. 19, when the CH-LOCOS distance is equal to 0.2 μm, an electric current such as about $10^{-8}$ A already flows through an ohmic contact portion. Namely, it should be understood that a p/n junction is already broken in the ohmic contact formed in the general forming method when the CH-LOCOS distance is equal to 0.2 μm.

In this embodiment, the heat treatment for electrically activating the implanted ions is executed for a short time by using a lamp heating method. The lamp heating method has characteristics in which an activating rate of the implanted ions is high and a moving amount of each of the implanted ions in a depth direction is small. Further, concentration of electrically active impurities within a silicon diffusive layer becomes high in a region near an interface between the silicon diffusive layer and an insulator film. Therefore, it is possible to form ohmic contact providing a low contact resistance.

In a semiconductor manufacturing method of the present invention, heat treatment for activating implanted ions is executed before a contact hole is formed. The contact hole is formed after this heat treatment. Thus, deformation of the contact hole caused by the heat treatment can be completely prevented. For example, the contact hole is formed in a sequentially tapered shape by using a SOG film as a mask having a small selective ratio with respect to an insulating film formed on a semiconductor substrate. Thus, ohmic contact having a low contact resistance can be reliably formed even when the contact hole has a small diameter.

A mask pattern using a photolithographic method can be formed by setting the mask formed on the insulating film to a mask of a multilayer structure including a photoresist. The insulating film can be more preferably protected by including a heat resisting layer with respect to the heat treatment taken to activate the implanted ions. An activating rate or percentage of the implanted ions can be increased and a moving amount of each of the implanted ions in a depth direction can be reduced by taking the above heat treatment using a lamp heating method. Thus, concentration of electrically active impurities becomes high in a silicon diffusive layer portion on a silicon diffusive layer interface so that ohmic contact having a low contact resistance can be formed.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for forming ohmic contact, comprising the steps of:

forming an insulating film having a thickness on a diffusive layer formed on a semiconductor substrate;

forming a mask on said insulating film, the mask having a selective ratio which is less than said insulating film and having an opening portion for a contact hole, the mask being formed of a material having heat resistive properties;

implanting ions into the diffusive layer through said opening portion;

providing heat treatment to electrically activate the implanted ions prior to formation of a contact hole, using the mask to limit the activated ions to a predetermined region of the diffusive layer during the heat treatment;

after providing the heat treatment, completely removing said mask and forming the contact hole by simultaneously etching said mask and the insulating film exposed through the opening portion of said mask; and making an electrode come in ohmic contact with the semiconductor substrate exposed from the formed contact hole.

2. A method for forming ohmic contact as claimed in claim 1, wherein the process for forming the mask forms a mask on said insulating film having a multilayer structure including a photoresist and at least one other layer.

3. A method for forming ohmic contact as claimed in claim 1, wherein the process for forming the mask forms a mask on said insulating film having a multilayer structure including a photoresist and a layer which is formed below the photoresist and having heat resisting properties and a selective ratio less than the insulating film.

4. A method for forming ohmic contact as claimed in claim 3, wherein the layer having the heat resisting properties of the mask of said multilayer structure and having the selective ratio less than the insulating film is a SOG film.

5. A method for forming ohmic contact as claimed in any one of claims 1 to 4, wherein the process for providing heat treatment after the ion implantation is performed by a heating lamp.

* * * * *